United States Patent [19]
Murphy et al.

[11] Patent Number: 5,274,195
[45] Date of Patent: Dec. 28, 1993

[54] LAMINATED CONDUCTIVE MATERIAL, MULTIPLE CONDUCTOR CABLES AND METHODS OF MANUFACTURING SUCH CABLES

[75] Inventors: Davis W. Murphy; Dennis A. Bonnette, both of Hudson; Thomas H. Stearns, Nashua, all of N.H.

[73] Assignee: Advanced Circuit Technology, Inc., Nashua, N.H.

[21] Appl. No.: 891,700

[22] Filed: Jun. 2, 1992

[51] Int. Cl.$^5$ ............................................. H01B 7/08
[52] U.S. Cl. .................. 174/117 FF; 29/847; 29/882; 29/884; 156/51; 156/630; 156/634; 156/650; 156/656; 174/268; 428/675
[58] Field of Search .................. 174/117 FF, 268; 156/50, 51, 630, 634, 650, 656; 29/847, 882, 884; 428/626, 675; 439/65, 492

[56] References Cited
U.S. PATENT DOCUMENTS

| | | | |
|---|---|---|---|
| 3,052,015 | 9/1962 | Kerstetter | 428/675 X |
| 3,074,043 | 1/1963 | Stearns et al. | 439/77 |
| 3,221,286 | 11/1965 | Fedde | 439/67 |
| 3,239,798 | 3/1966 | Silver | 439/631 |
| 3,399,452 | 9/1968 | Reid | 29/882 |
| 3,501,831 | 3/1970 | Gordon | 174/263 |
| 3,661,755 | 8/1971 | Shiells, Jr. | 439/492 |
| 3,731,254 | 5/1973 | Key | 174/DIG. 3 X |
| 3,875,542 | 4/1975 | Holland et al. | 333/245 |
| 4,085,502 | 4/1978 | Ostman et al. | 29/629 |
| 4,089,734 | 5/1978 | Bierig | 156/656 |
| 4,246,563 | 1/1981 | Noerholm | 337/296 |
| 4,272,753 | 6/1981 | Nicolay | 337/297 |
| 4,357,750 | 11/1982 | Ostman | 29/847 |
| 4,483,906 | 11/1984 | Nakatsugawa | 428/675 X |
| 4,503,112 | 3/1985 | Konicek | 428/675 X |
| 4,771,260 | 9/1988 | Gurevich | 337/231 |
| 4,950,553 | 8/1990 | Walsh et al. | 428/626 |
| 5,099,219 | 3/1992 | Roberts | 337/297 |

FOREIGN PATENT DOCUMENTS

| | | | |
|---|---|---|---|
| 2136386 | 2/1973 | Fed. Rep. of Germany . | |
| 102326 | 5/1988 | Japan | 428/675 |

*Primary Examiner*—Morris H. Nimmo
*Attorney, Agent, or Firm*—Davis, Bujold & Streck

[57] ABSTRACT

A laminate comprising metal layers separated by an etchant barrier to control depth of etching of the laminate, the barrier being etchable by an etchant which is not an etchant for the layers. A cable incorporating such a laminate and having relatively flexible conductors integral with relatively rigid terminals. A method of making such a cable, using the laminate, by selectively etching the layers down to the barrier to form the conductors and terminals, stripping the barrier and laminating the conductor with an insulating material preferably extending over at least a portion of the terminals to reinforce the conductor terminal transition and a cable when made of such a method.

27 Claims, 7 Drawing Sheets

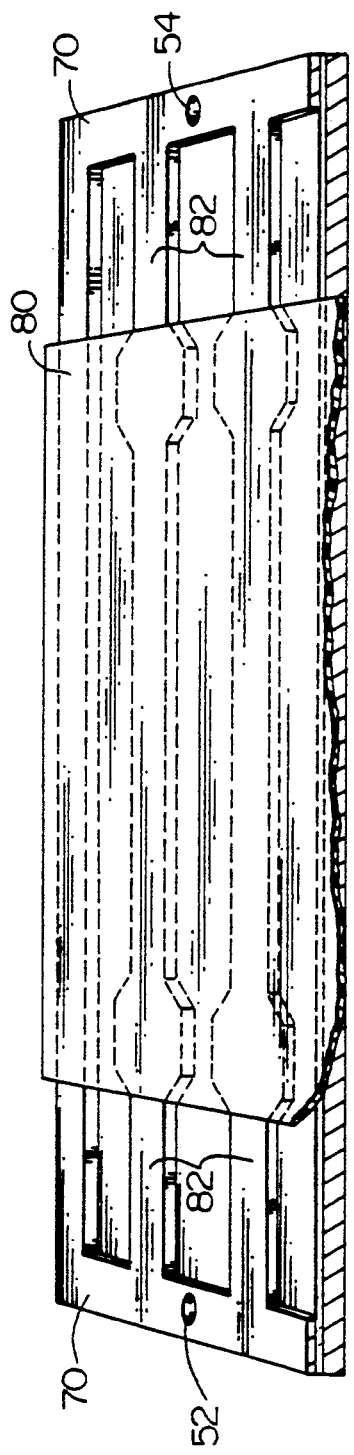
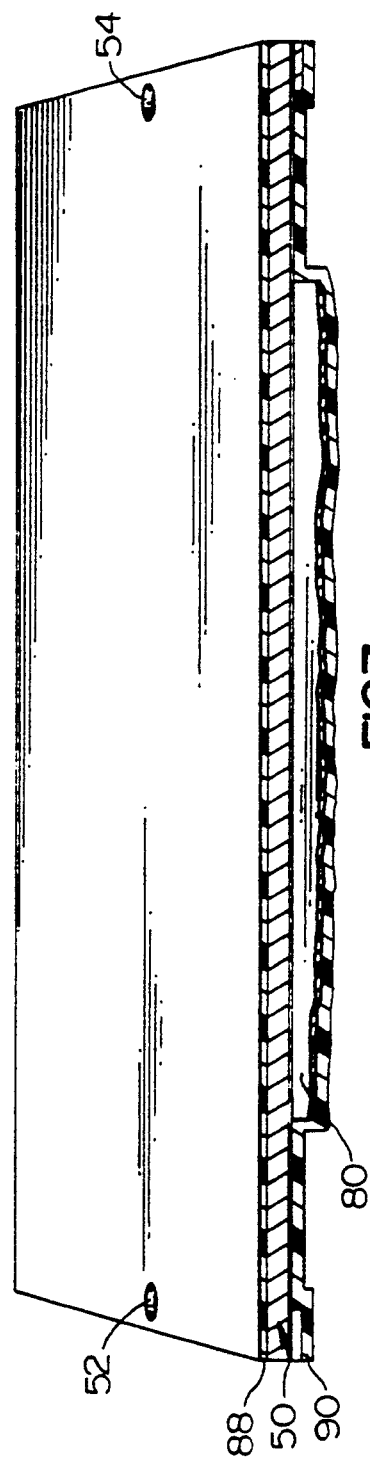

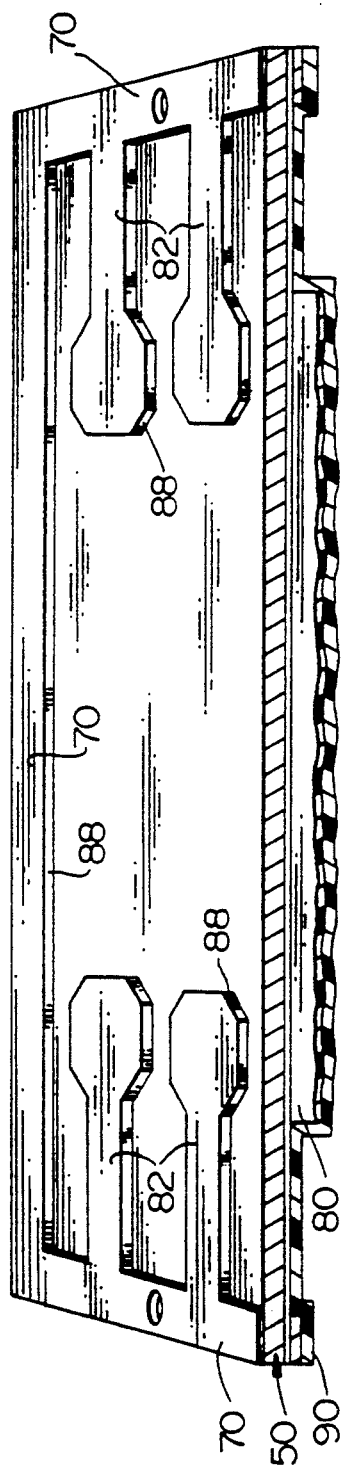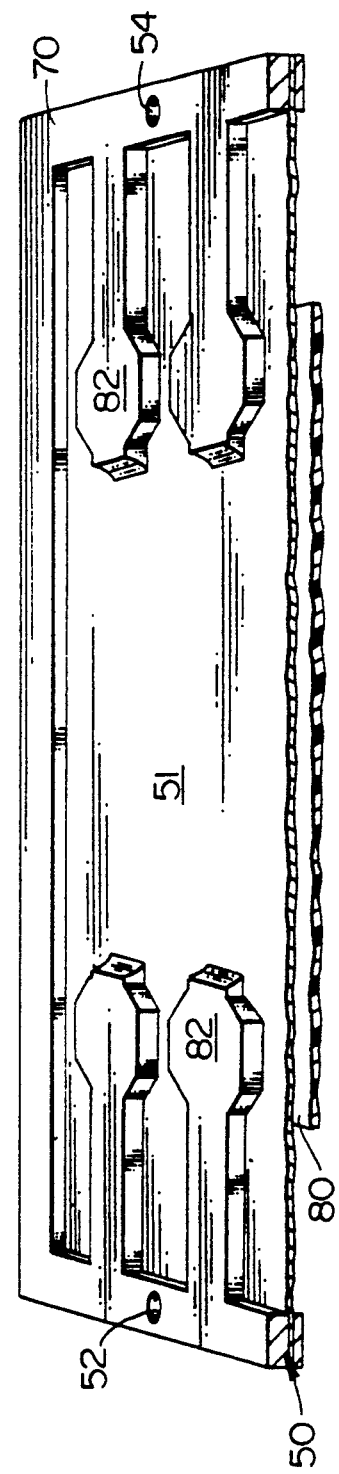

LAMINATED CONDUCTIVE MATERIAL, MULTIPLE CONDUCTOR CABLES AND METHODS OF MANUFACTURING SUCH CABLES

This invention relates to a laminated material, electrical connecting devices and to methods of manufacturing such devices, and more particularly, though not exclusively, to laminates which comprise materials etchable by mutually exclusive etchants, to flat multiple conductor cables incorporating such laminates and to methods of manufacturing such cables.

BACKGROUND OF THE INVENTION

Various flat multiple conductor cables are well known in the art and are available commercially. In the past a principal obstacle to wide spread adoption of multiple conductor cables has been the relatively high manufacturing cost due primarily to direct labor costs. Another factor limiting wide spread adoption of multiple conductor cables is the inability of the art to simply and economically produce cables to custom designs.

It has been proposed in U.S. Pat. No. 4,357,750 (assigned to the assignee of the present application) to produce an electrical cable comprising a plurality of spaced metallic conductors formed from a monolithic rigid metallic sheet by selectively reducing the sheet in cross-section so as to define conductor patterns with integral terminal ends, and to render flexible, desired areas of the conductors. Two chemical milling (etching) steps are disclosed, the first of which is to remove metal from selected portions on one face of the sheet and the second of which is to remove metal from selected portions from the opposite face of the sheet until breakthrough occurs leaving a plurality of flexible conductors integral with rigid terminals.

The method of producing electrical cable proposed in U.S. Pat. No. 4,357,750 involves difficulty in controlling the depth (the Z axis) of metal removal in the chemical milling steps which in turn limits the accuracy with which the thickness and width of conductors can be produced. Typically, in such a method, there results a 25% variation in thickness which results in a 25% variation in reduction of conductor width. This is a consequence of the fact that chemical milling proceeds more or less at an angle, from the surface being etched, such that for each unit of thickness of metal thickness removed, the width of an adjacent feature is reduced. The limitations mentioned result in constraints in the width, thickness and spacing of conductors which may be produced with the consequent limitation of the application of the method of U.S. Pat. No. 4,357,750 to densely packed conductors and terminals.

Cables produced in accordance with U.S. Pat. No. 4,357,750 must be carefully designed in order to avoid fatigue problems at the transitions from relatively flexible conductors to relatively rigid terminals in situations involving repeated flexing of these transitions and this limits freedom of design and range of applications.

It is an object of the present invention to provide a novel laminate suitable for producing improved multiple conductor cables having flexible portions and rigid terminals.

Another object of the present invention is to provide a relatively simple and inexpensive method for producing a cable of the type above described with an improved conductor packing density potential.

Yet another object of the present invention is to provide a novel multiple conductor cable having relatively flexible conductors integral with relatively rigid terminals.

Yet another object of the present invention is to provide reinforcement of the transition from the relatively flexible conductors to the relatively rigid terminals to reduce fatigue problems at this transition.

SUMMARY OF THE INVENTION

Generally, in accordance with the present invention, a cable comprising a plurality of spaced metallic conductors, including one or more relatively flexible areas integral with relatively rigid terminals, is formed from a relatively rigid composite metallic sheet including a barrier layer by selectively reducing the sheet in cross-section to the barrier layer so as to define the conductor patterns and terminals, and to render flexible, at areas of reduced cross-section, areas of the conductors. The terminals may be located at the conductor ends or anywhere along their length and may be raised pads or projecting fingers of any desired form. The metallic conductors and, in preferred embodiments, portions of the terminals are laminated to flexible insulating films, so as to support and maintain the metallic conductors and terminals in spaced relation to one another and to reinforce transitions between conductors and terminals.

The purpose of the barrier layer is to provide an assured thickness-stopping-point for the steps used to create terminal areas and conductor runs, thus removing the skill and control which is required in the present process.

According to a first aspect, the present invention provides a laminate comprising an electrically conductive barrier layer sandwiched between, and in electrically conductive intimate contact throughout the laminate with, a first lamina of an electrically conductive material and a second lamina of an electrically conductive material, wherein the materials are chosen so that the first lamina may be chemically milled by an etchant which is not an etchant for the barrier layer and the second lamina may be chemically milled by an etchant which is not an etchant for the barrier layer.

According to a second aspect of the present invention, the laminate defines a terminal and is integral with a flexible electrical conductor.

According to a third aspect, the present invention provides a method of forming a cable having a relatively flexible electrical conductor integral with a relatively rigid electrically conductive terminal wherein said terminal (1) is generally flat, (2) is thicker in cross-section than at least one region of said conductor, and (3) derives its relative rigidity by virtue of the relative thicker cross-section, said method comprising the steps of (A) providing a relatively rigid laminate of cross-sectional thickness substantially equal to that required for said terminal; said laminate comprising two electrical conductive structural layers separated by an electrically conductive barrier layer; (B) selectively reducing portions of said laminate in cross-section to the barrier layer, by a process which is constrained by the barrier layer, so as to (i) increase the relative flexibility of said sheet in said at least one region, and (ii) define, in situ, said conductor and said terminal; and (C) covering said conductor at least in part with a flexible insulating material.

According to a fourth aspect, the present invention provides a method of forming a cable having a plurality of spaced relatively flexible electrical conductors each integral with a relatively rigid electrically conductive terminal wherein said terminals (1) are generally flat, (2) are thicker in cross-section than at least one region of relative flexibility, and (3) derive their relative rigidity by virtue of their relative thicker cross-section, said method comprising the steps of (A) providing a relatively rigid laminate of a cross-sectional thickness substantially equal to that required for said terminals; said sheet having two structural electrically conductive laminae spaced apart by an electrically conductive barrier layer; (B) selectively reducing portions of said laminate in cross-section to the barrier layer so as to define in situ said terminals, of approximately said sheet thickness, and said region of relative flexibility and (C) laminating said conductors between a pair of flexible insulating films so as to support and maintain said conductors together with their terminals in spaced relation to one another.

According to a fifth aspect, the present invention provides a method of forming a cable having a plurality of spaced metallic electrically conductive elements, each of said elements including at least one relatively rigid terminal and at least one region of relative flexibility wherein said terminals (1) are thicker in cross-section than the regions of relative flexibility, and (2) derive their relative rigidity by virtue of their relative thicker cross-section, said method comprising the steps of providing a composite metallic sheet of a cross-sectional thickness substantially equal to that required for said relatively rigid terminals; said sheet comprising two laminae, each comprising one of copper and an alloy in which copper is a major constituent, spaced by and in intimate electrically conductive contact throughout with an electrically conductive barrier layer, said laminae and said barrier layer being etchable by at least one selection of mutually exclusive etchants; chemically milling said composite metallic sheet to (i) increase the relative flexibility of said sheet in the regions and (ii) define in situ a plurality of spaced elements including said terminals, said chemical milling involving first chemically milling one of said laminae, using an etchant which is not an etchant for the barrier layer, so as to remove metal from selected portions thereof to a depth constrained by said barrier layer so as partially to define, in situ, a pattern of said elements including said terminals; bonding a first insulating sheet to said milled lamina; then chemically milling the other of said laminae, using an etchant which is not an etchant for the barrier layer, so as to remove metal from selected portions thereof to a depth constrained by said barrier layer so as to further define, in situ, the pattern; subsequently stripping the barrier layer using an etchant, which is not an etchant for the laminae, to define, in situ, said pattern; and bonding a second insulating sheet to said other milled lamina.

The invention also provides a cable when made by the inventive methods.

BRIEF DESCRIPTION OF THE DRAWINGS

Various aspects of the present invention will now be described, by way of example, with reference to the accompanying drawings, wherein like numbers depict like parts, in which:

FIGS. 4–10 are perspective views of a cable at various stages of formation in accordance with the process of FIG. 3;

DESCRIPTION OF THE PREFERRED EMBODIMENTS

As used herein the terms "rigid" and "flexible" are employed in their relative sense and with regard to an intended utility. For example when the term "flexible" is used for describing selected areas in accordance with the invention, it is intended that the cable have, at such areas, the capacity to be bent, or twisted within predetermined limits without fracture or fatigue. The particular circuit design will determine the required degree of flexibility. The term "rigid" as applied to the terminals means that the terminals are sufficiently stiff and rigid to permit direct assembly and connection (e.g. as by mass wave soldering) to a circuit board.

Figure 1:
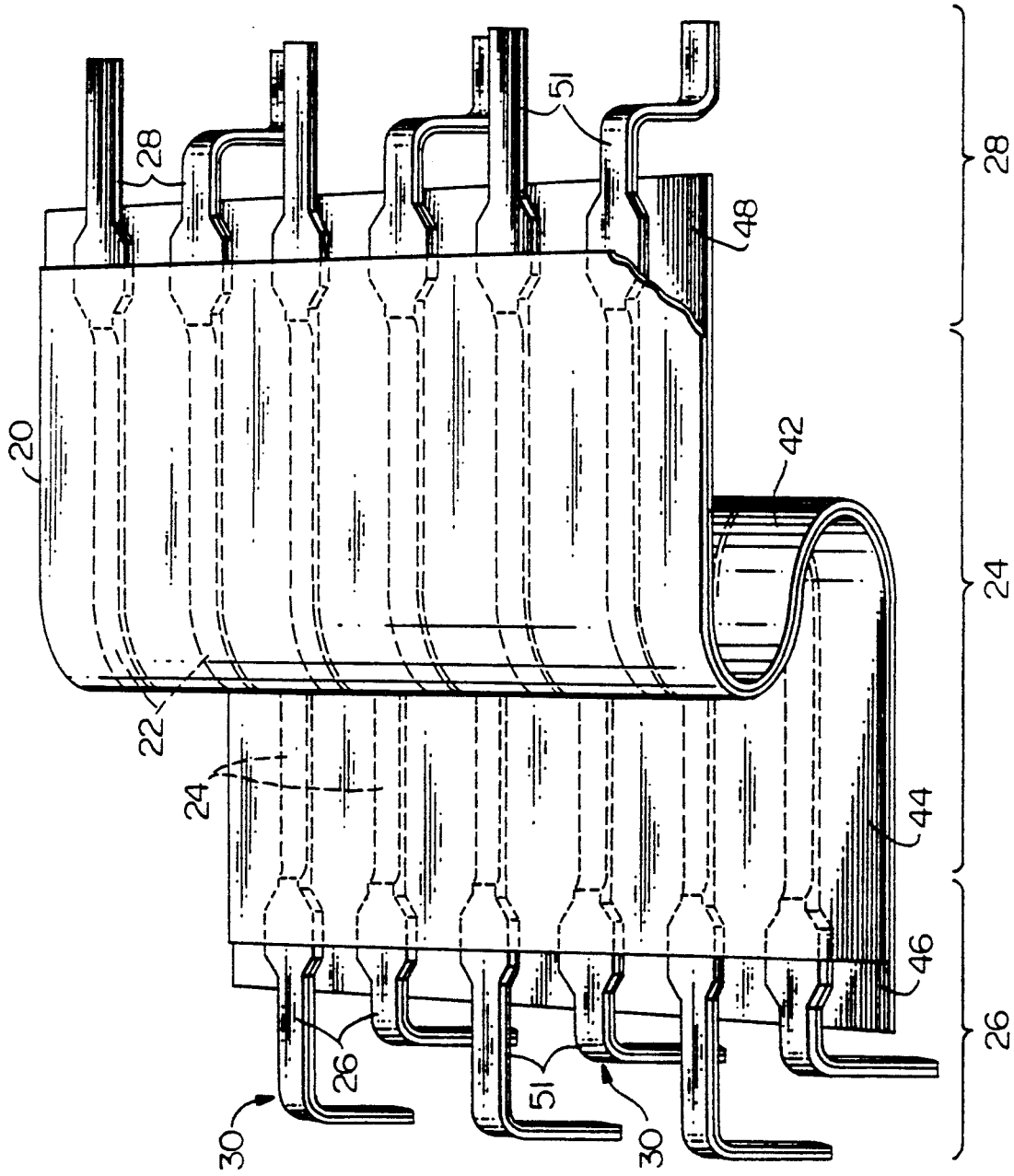
FIG. 1 is a perspective view of one form of multiple conductor cable constructed in accordance with the present invention.
Figure 11:
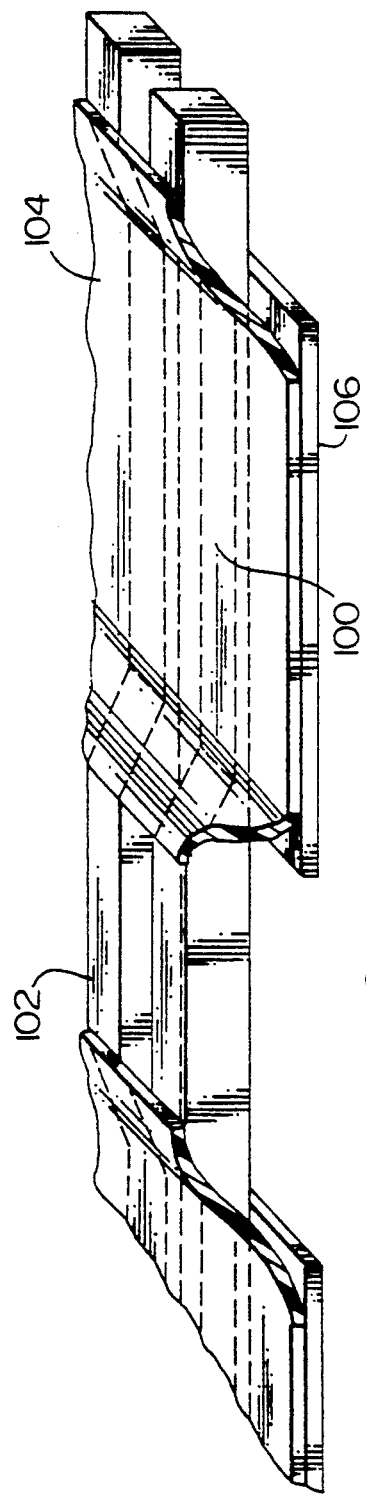
FIG. 11 is a fragmentary perspective view of cable with rigid terminals formed intermediate the longitudinal extent of the conductors.

One embodiment of cable (e.g. a jumper cable) in accordance with the present invention is shown in FIG. 1 of the drawings. Referring to FIG. 1, for illustrative purposes a jumper cable 20 is shown comprising six spaced metallic conductors 22. It will be understood however, that the jumper cable may comprise any number of conductors as may be desired. Each conductor 22 comprises a flexible central portion 24 extending between rigid terminal ends 26 and 28 (or pads as shown at FIG. 11). Conductors 22 have dimensions, and shapes corresponding to the required design criteria, e.g. current carrying capacity, flexibility requirements, and cable geometry. Typically, those portions of conductors 22 which are intended to be flexible will have a thickness in the range of 0.03 mm to 0.1 mm, depending on the degree of flexibility required and the hardness of the metal. Terminals 26 and 28 typically will have a thickness in the range of 0.1 mm to 1.0 mm or more, depending on the degree of stiffness required and the hardness of the metal.

Figure 2:
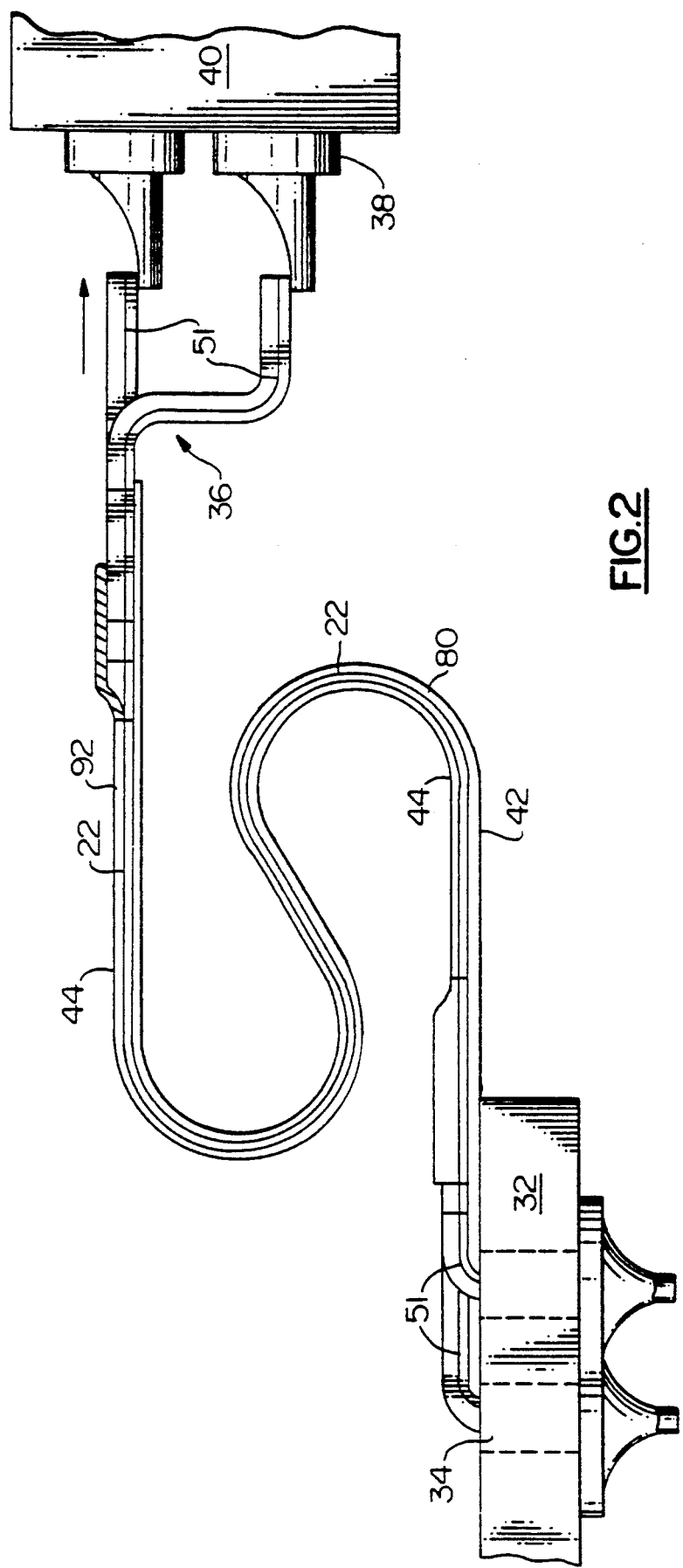
FIG. 2 is a side elevation of the cable shown in FIG. 1 showing exemplary modes of connection.
Figure 3:
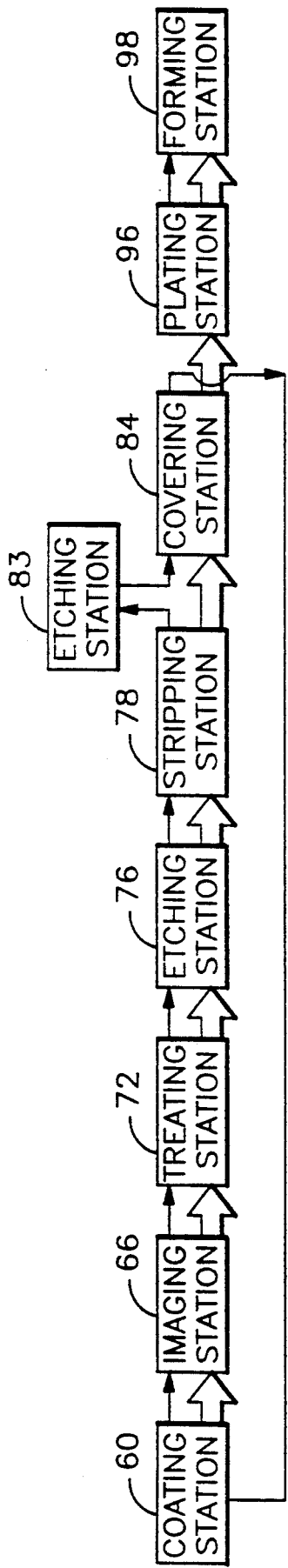
FIG. 3 is a diagrammatic illustration of a process for producing the cable of FIG. 1 in accordance with the teachings of the present invention.

As seen in FIGS. 1 and 2, terminal ends 26 and 28 are integral extensions of the conductor central portions 24. Terminal ends 26 and 28 may be formed or shaped for the particular connection purpose required. Thus for example, terminal ends 26 may be bent at right angles at 30 for insertion into apertures 34 in a circuit board 32, while terminal ends 28 may be bent and formed as at 36 for connection to solder cups 38 of connector 40 (FIG. 2). Preferably the terminals are offset from one another as shown so as to provide greater isolation between adjacent connection points. Obviously terminal ends 26 and 28 will be sized and spaced to meet design criteria for custom application or for mating with standard terminal connectors.

The individual conductors 22 are supported and maintained in spaced relation to one another by sandwiching the conductors 22, between first and second dielectric films 42 and 44, respectively. Film 42 is bonded to the bottom surface of conductors 22, and preferably also extends partially under the terminal ends, e.g. as at 46 and 48. Film sheet 44 is bonded across the top surface of conductors 22, and also covers part of the terminal ends 46, 48. Films 42 and 44 are also bonded to each other in the areas between conductors 22. Films 42 and 44 preferably are formed of an electrically insulating polymeric film material such as a polyester, polypropylene, polyimide, cellulose triacetate, polyethylene terphthalate or other readily available flexible film. The film thickness is not critical to the invention and will depend upon the particular film or films employed, the required degree of flexibility and the electrical insulation requirements. Films 42 and 44 may be bonded to conductors 22 by adhesive means such as a thermoplastic or thermosetting adhesive, or one or both of films 42 and 44 may be formed in-situ on the conductors as by casting in known manner. Both films 42 and 44 overlap the terminal ends 46, 48 and are attached thereto to protect against localized flexure in order to prevent fatigue failure which may otherwise result at the junction between the flexible conductors 22 and rigid terminals 26, 28.

The present invention is predicated in part on mass forming a plurality of metallic conductors from a metallic laminate, as described hereinafter with reference to FIG. 13, by selectively reducing the sheet in cross-section so as to define the conductor patterns and areas of relative flexibility while leaving full thickness for the terminals.

A method of forming a flexible jumper cable in accordance with the present invention will now be described with reference to which FIGS. 3–10 which illustrate the formation of a flexible jumper cable in accordance with the present invention employing chemical milling techniques.

Figure 13:
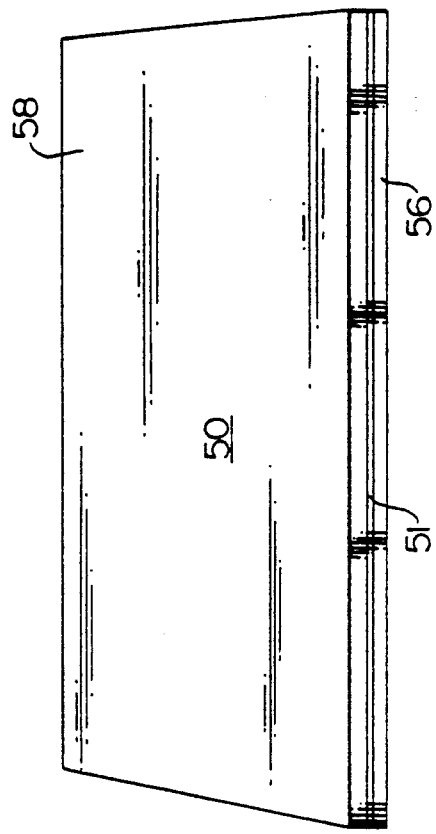
FIG. 13 is a perspective view of a laminate according to the present invention.

A sheet of laminate 50 is provided (FIG. 13). This laminate comprises a layer 56 0.08 mm (3 mils) thick of annealed copper, a layer 58, 0.180 mm (7 mils) thick, of semihard copper (or brass) separated by, and in intimate physical and electrical contact therewith throughout, a barrier layer 51, 0.0013 mm (50 micro inches) thick, of nickel 51.

The next step involves coating the metallic sheet top and bottom surfaces 56 and 58 at a coating station 60 with conventional acid resist materials 62 and 64, respectively. Then acid resist material 62 is exposed, at an imaging station 66, to an artwork image of the desired conductor pattern 68 which also includes a border area 70 at the edges of the sheet (see FIG. 4). This artwork is registered to the metallic sheet using registration holes 52 and 54. Layers 62 and 64 is exposed to light at imaging station 66 and those areas of resist coating 62 and 64 exposed to light are thereby altered to a lower molecular weight polymer. The sheet is then immersed in a preferential solvent and developed at a treating station 72, with the result that the bottom resist layer 64, and portions of resist layer 62 (i.e. the conductor pattern 68 and border area 70) remain intact while other areas 74 are dissolved away leaving a resist layer 62 in positive image of the desired conductor pattern 68 and border area 70.

The next step involves chemically milling the exposed metallic areas by contacting sheet 50 with an etching solution 76, e.g. ammoniated cupric chloride. Etching is controlled by the nickel barrier layer 51 so as to stop removal of metal at a depth which equals that desired for the flexible central portions 24 of the conductors. For example, if 0.08 mm thick flexible conductors are desired, the barrier layer is at a depth of 0.08 mm and etching is thereby precisely controlled to a depth of 0.08 mm. The control of etching depth is achieved as a result of nickel being highly resistant to typical copper etchants, i.e. ammoniated cupric chloride.

Figure 5:
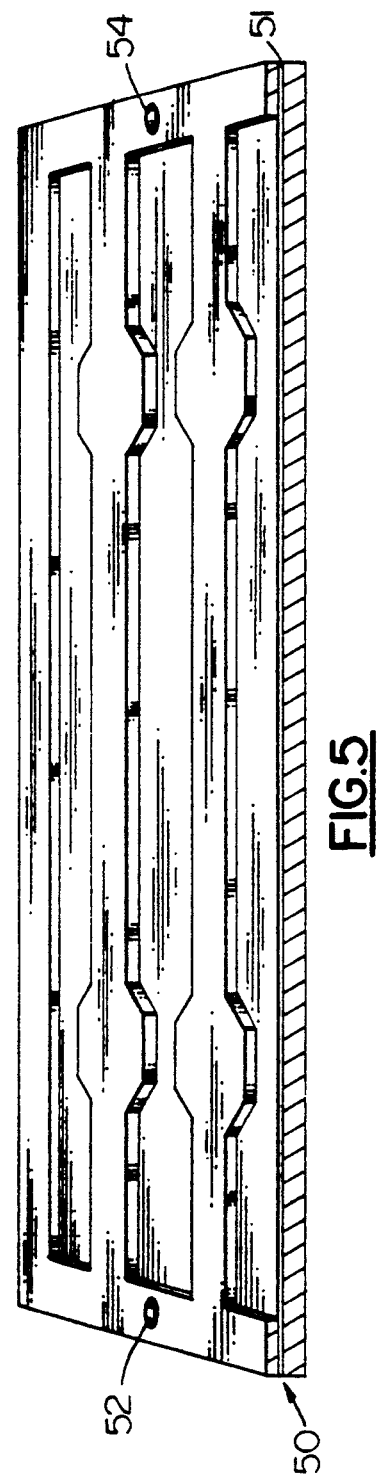

Thereafter, the sheet is treated in a stripping station 78 wherein the resist remaining on the sheet is removed. The resulting sheet appears substantially as shown in FIG. 5.

The next step is to partially cover the etched side of metallic laminate 50 with a thin, flexible insulating film such as 0.08 mm (3 mils) polyimide film 80. As shown in FIG. 6, film 80 is cut to a size and shape so as to cover the central conductor areas of sheet 50, and a portion of the terminal areas 26, 28, but leaving uncovered end portions 82 of the conductors and the border areas 70. Film 80 is applied to sheet 50 at covering station 84 (FIG. 3), and the film is bonded to the metallic sheet by means of a suitable adhesive such as a thermoplastic or thermosetting adhesive.

Metallic laminate 50 is then turned over, and the laminate returned to coating station 60 where the exposed surfaces of layers 56 and 58, and film 80 are covered with layers of conventional resist material 88, 90 (FIG. 7). Then, using registration holes 52, 54 to insure front-to-back image registration, resist layer 88 is exposed to a negative artwork pattern, at imaging station 66, redefining the terminals 82 and border area 70. However, the central areas of the conductor pattern are not redefined in this imaging step. The sheet is then treated in treating station 72, with the result that exposed portions of the resist layers 88, 90 remain intact while the unexposed areas are dissolved away as before. The resulting structure appears substantially as shown in FIG. 8.

Sheet 50 is then chemically milled in etching station 76, as before, down to the nickel layer 51. This occurs at a depth of 0.18 mm using the exemplary panel thickness given above. At this point the conductor patterns and the relative thicknesses of the conductor flexible central portions and rigid terminal ends are determined. All resist is then stripped at station 78. The resulting laminate appears substantially as shown in FIG. 9. The laminate as shown in FIG. 9, is then exposed at a nickel etching station 83 to a nickel etchant such as a tin-lead stripper or other etchant, which will etch nickel, while failing to etch copper, so as to etch away the exposed nickel layer. It will be appreciated that the imaging and etching sequence could be reversed, i.e. terminals first and then flexible areas followed by the nickel strip. In such a reversal the nickel strip might take place between the first the and second copper etch cycles.

Figure 10:
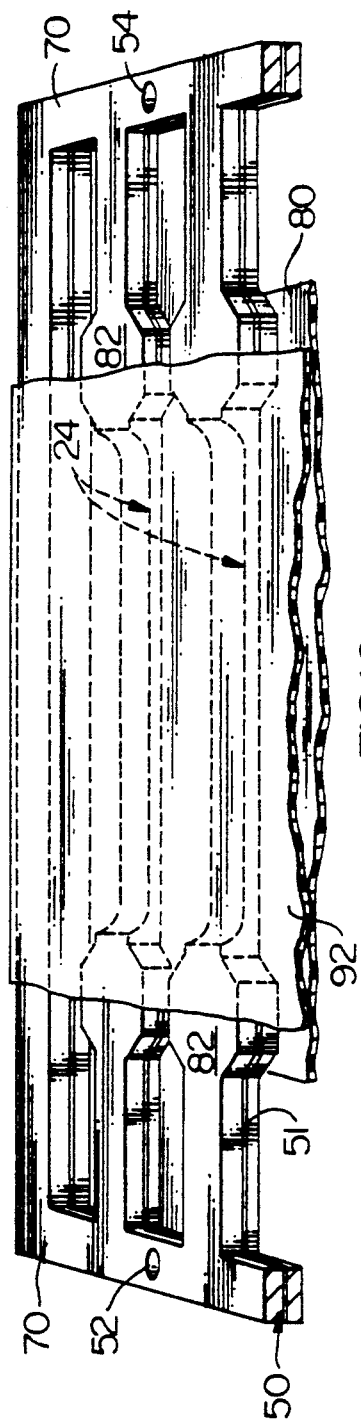

As depicted in FIG. 10, a thin insulting film such as polyimide film 92 is then cut to size and shape and placed in the cavity, defined by end portions 82, at covering station 84. Film 92 is then adhesively bonded in known manner to the conductor central portions, to portions of terminals 82, and to film 80. As seen in FIG. 10, the resulting structure is a copper panel comprising a plurality of spaced conductors including relatively thin central portions 24 and relatively thick portions 82 joined at a relatively thick common border 70, and with the central portions 24 laminated between a pair of thin films 80, 92 which extend in stress relieving manner over the transitions between the flexible conductors 24 and the rigid terminal ends 82 onto the terminal ends 82 to reinforce these transitions and resist fatigue thereat.

At this point the exposed copper may be plated at a plating station 96 with a tin/lead alloy or a precious metal, using border 70 as a common bus bar. Thereafter, using border 70 for support and registration, the resulting structure is passed to a forming station 98 whereat end portions 82 are cut free from border 70, and the end portions 82 shaped for the desired connection purpose by means of a forming press. The resulting structure is a multiple conductor cable. It is to be understood that while only two conductors are depicted in the foregoing processing figures, sheet 50 may have a width suited to provide several jumper cables of a given number of conductors. Thus, for example, a hundred conductor wide structure can be produced for cutting, for example, into twenty jumper cables of five conductors each.

FIG. 11 illustrates a variation of the cable illustrated in FIGS. 1 and 2 in which flexible conductors 100 are interconnected by rigid terminals or pads 102 formed in a manner apparent to those who have followed the above described process. The transitions between rigid terminals 102 and flexible conductors 100 are once again reinforced by the dielectric layers 104, 106.

Figure 12:
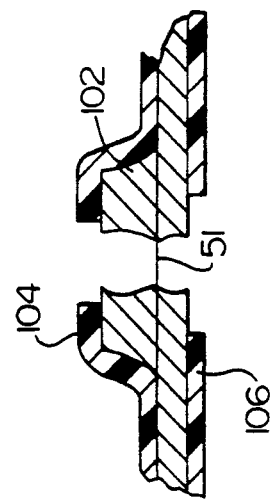
FIG. 12 is a fragmentary cross-section of a cable according to FIG. 11 wherein rigid terminals have an etched through-hole formed therein using the process and laminate of the present invention.
Figure 4:
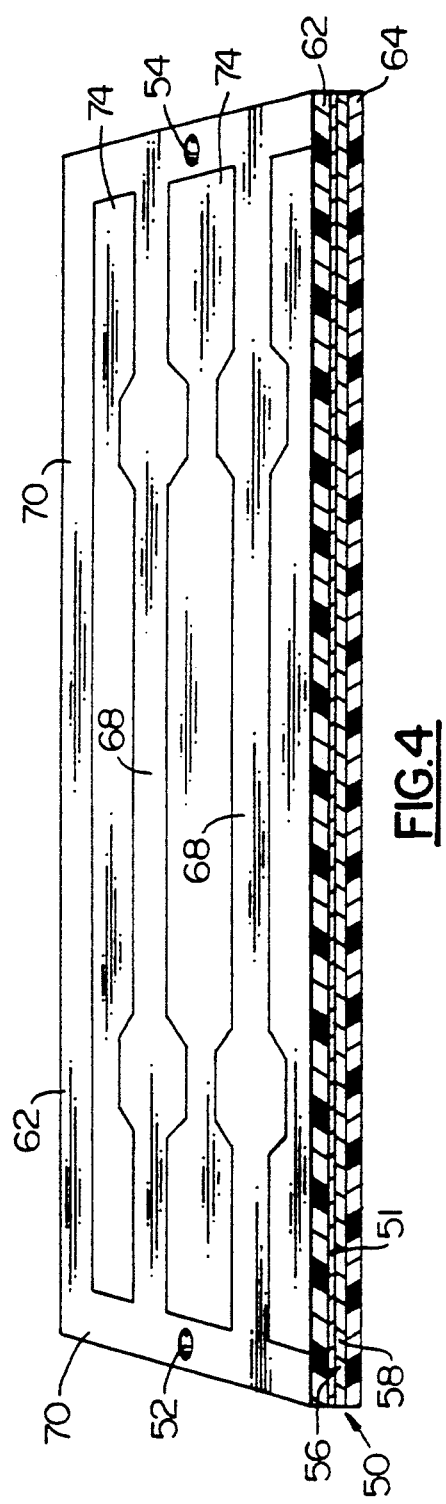

FIG. 12 illustrates a variation of FIG. 11 in which a through-hole is etched in a rigid terminals or pads 102 using the techniques of the present invention. As shown the through-hole is shown immediately before the nickel etching step which will remove the nickel barrier layer 51 to the extent exposed in the hole.

The present invention is predicated on the provision of a laminate having a construction involving the provision of two lamina of material separated by a barrier layer of another material, the materials of the two lamina being etchable by at least one etchant which has substantially no etching effect on the material of the barrier layer and vice-versa. The two layers are preferable of the same basic material but not essentially so.

In the preferred embodiment the laminate or composite sheet 50 (FIG. 13) consists of two layers 56, 58 of copper or an alloy in which copper is a major constituent separated by a barrier layer 51. The two layers 56, 58 are selected as to composition and thickness in accordance with the demands of the design. The barrier layer is selected from the metals which are:
  a. resistant to the etchants used to machine the two metal layers to desired configuration
  b. has its own specific etchant which will remove it with little affect on the two metal layers
  c. has mechanical and thermal properties exceeding the requirements of the multiconductor cable and its application.

Nickel is highly resistant to typical copper etchants yet readily strips in tin-lead stripper solutions or persulphate etchants. Also nickel withstands all production processes, stresses and soldering.

The laminate may be produced, for example, by electroplating 1.3 microns (50 micro inches) of nickel onto 0.1 mm (4 mils) of semihard copper or brass (for terminals) and then electroplating 0.025 mm (1 mil) copper for (flexible conductors) onto the nickel barrier layer. A cladding or cold welding process for producing the laminate may also be appropriate.

Certain changes may be made in the above apparatus and process without departing from the scope of invention herein as will be obvious to one skilled in the art. For example, precision die flattening and cutting techniques are known per se in the art and may be adopted for defining the conductor spacing and thickness. Moreover, one skilled in the art will appreciate that it is possible to start with a metallic sheet somewhat thinner than desired for the terminal ends. Processing will be as before except preplating will be used not only to improve solderability, but also to deposit sufficient metal to achieve desired terminal thickness. Still other changes will be obvious to one skilled in the art, and it is therefore intended that all matter contained in the above description shall be interpreted in an illustrative and not in a limiting sense.

Attention is drawn to the aforementioned U.S. Pat. No. 4,357,750 with respect to certain apparatus and techniques which, while potentially useful with respect to the present invention, are not essential to the performance of the best known mode of performing the present invention and are not therefor included in detail herein.

As used herein "terminal" shall be construed to include a "pad" which may, for example, be disposed intermediate the ends of a flexible conductor.

While the preferred embodiments have been described with reference to chemical milling of the barrier (nickel) layer by means of an etchant, it will be appreciated that the barrier layer could be (i) of another material e.g. niobium and (ii) could be stripped by other means than etching e.g. electron beam machining, sand blasting, laser machining, etc.

It will also be appreciated that while the laminate 50 has been described with reference to layers 56, 58 being of copper or an alloy in which copper is a major constituent with layer 56 preferably being annealed and layer 58 preferably being semihard, the layers could be of any desired temper or tempers, e.g. to provide very flexible conductors and hard or even spring temper for the terminals. Also the layers 56, 58 could be of different electrically conductive materials provided these provide the required integrity of the laminate and ability to be selectively chemically milled relative to the barrier layer.

We claim:

1. A relatively rigid laminate in combination with a relatively flexible electrically conductive circuit means, the laminate comprising an electrically conductive barrier layer sandwiched between, and in electrically conductive intimate contact throughout the laminate with, a first lamina of an electrically conductive material and a second lamina of an electrically conductive material, wherein the materials are chosen so that the first lamina may be chemically milled by an etchant which is not an etchant for the barrier layer and the second lamina may be chemically milled by an etchant which is not an etchant for the barrier layer; said circuit means being integral with said laminate means as an extension of said laminate.

2. A laminate according to claim 1 wherein the materials are chosen so that the barrier layer may be chemically milled by an etchant which is not an etchant for the first and second laminae.

3. A laminate according to claim 2 wherein the electrically conductive materials of the first and second laminae are at least one of copper and alloys in which copper is a major constituent.

4. A laminate according to claim 3 wherein the barrier layer is nickel.

5. A laminate according to claim 1, wherein the circuit means is an extension of one only of the laminae.

6. A laminate according to claim 5, wherein there is a transition from said relatively flexible circuit means to said relatively rigid laminate and said circuit means is covered by a flexible insulating material which extends over the transition to reinforce that transition.

7. A laminate according to claim 6 wherein the flexible insulating material is polyimide.

8. A method of forming a cable having a relatively flexible electrical conductor integral with a relatively rigid electrically conductive terminal wherein said terminal (1) is generally flat, (2) is thicker in cross-section than at least one region of said conductor, and (3) derives its relative rigidity by virtue of the relative thicker cross-section, said method comprising the steps of:

(A) providing a relatively rigid laminate of cross-sectional thickness substantially equal to that required for said terminal; said laminate comprising two electrical conductive structural layers separated by an electrically conductive barrier layer;

(B) selectively reducing portions of said laminate in cross-section to the barrier layer, by a process which is constrained by the barrier layer, so as to (i) increase the relative flexibility of said cable in said at least one region, and (ii) define, in situ, said conductor and said terminal; and (C) covering said conductor at least in part with a flexible insulating material.

9. A method according to claim 8, wherein said structural layers comprise a metal selected from the group consisting of copper and alloys in which copper is a major constituent, and said selective reducing is by chemical milling by an etchant which is not an etchant for the barrier layer.

10. A method according to claim 9 wherein said barrier layer is nickel.

11. A method according to claim 8 wherein said laminate is selectively reduced to define said conductor and said terminal in three steps comprising:

a) chemically milling said laminate so as to remove selected portions of a first of said structural layers to a depth as constrained by said barrier layer thereby partially to define said conductor and said terminal;

b) chemically milling said laminate so as to remove selected portions of a second of said structural layers thereby to further define said conductor and said terminal; and c) stripping the barrier layer at least in part.

12. A method according to claim 11 wherein the depth of chemical milling of the second of said structural layers is constrained by said barrier layer and the barrier layer is stripped using an etchant which is not an etchant for the structural layers.

13. A method according to claim 8 comprising plating exposed portions of said terminal so as to increase the thickness of said terminals and therefore the relative rigidity thereof, and to improve electrical conductivity of said terminals.

14. A method according to claim 8 comprising extending said flexible insulating material over the transition from said at least one relatively flexible region to the thicker cross-section of said terminal thereby to reinforce said cable at said transition.

15. A method of forming a cable having a plurality of speed relatively flexible electrical conductors each integral with a relatively rigid electrically conductive terminal wherein said terminals (1) are generally flat, (2) are thicker in cross-section than said relatively flexible electrical conductors, and (3) derive their relative rigidity by virtue of their relative thicker cross-section, said method comprising the steps of:

(A) providing a relatively rigid laminate of a cross-sectional thickness substantially equal to that required for said terminal; said laminate having two structural electrically conductive laminae spaced apart by an electrically conductive barrier layer;

(B) selectively reducing portions of said laminate in cross-section to the barrier layer so as to define, in situ, said terminals, and said conductors, said terminals being approximately of said thickness; and (C) laminating said conductors between a pair of flexible insulating films so as to support and maintain said conductors together with their terminals in spaced relation to one another.

16. A method according to claim 15 comprising extending at least one of said films over transitions from conductors to the relatively thicker cross-section of the terminals thereby to reinforce said transitions.

17. A method according to claim 15, wherein said structural laminae comprise a metal selected from the group consisting of copper and alloys in which copper is a major constituent, and said selective reducing is by chemical milling by an etchant which is not an etchant for the barrier layer.

18. A method according to claim 17 wherein said barrier layer is nickel.

19. A method according to claim 15 wherein said laminate is selectively reduced to define said conductors and said terminals in three steps comprising:

a) chemically milling said laminate so as to remove selected portions of a first of said structural layers to a depth as constrained by said barrier layer thereby partially to define said conductors and terminals;

b) chemically milling said laminate so as to remove selected portions of a second of said structural layers thereby to further define said conductors and said terminals; and c) stripping the barrier layer at least in part.

20. A method according to claim 19 wherein the depth of chemical milling of the second of said structural layers is constrained by said barrier layer and the barrier layer is stripped using an etchant which is not an etchant for the structural layers.

21. A method of forming a cable having a plurality of spaced metallic electrically conductive elements, each of said elements including at least one relatively rigid terminal and at least one region of relative flexibility wherein said terminals (1) are thicker in cross-section than the regions of relative flexibility, and (2) derive their relative rigidity by virtue of their relative thicker cross-section, said method comprising the steps of:

(A) providing a composite metallic sheet of a cross-sectional thickness substantially equal to that required for said relatively rigid terminals; said sheet comprising two laminae, each comprising one of copper and an alloy in which copper is a major constituent, spaced by and in intimate electrically conductive contact throughout with an electrically conductive barrier layer, said laminae and said barrier layer being etchable by at least one selection of mutually exclusive etchants;

(B) chemically milling said composite metallic sheet to (i) increase the relative flexibility of said sheet in the regions and (ii) define in situ a plurality of spaced elements including said terminals, said chemical milling involving:

first chemically milling one of said laminae, using an etchant which is not an etchant for the barrier layer, so as to remove metal from selected portions thereof to a depth constrained by said barrier layer so as partially to define, in situ, a pattern of said elements including said terminals; bonding a first insulating sheet to said milled lamina; then chemically milling the other of said laminae, using an etchant which is not an etchant for the barrier layer, so as to remove metal from selected portions thereof to a depth constrained by said barrier layer so as to further define, in situ, the pattern;

subsequently stripping the barrier layer using an etchant, which is not an etchant for the laminae, to define, in situ, said pattern; and bonding a second insulating sheet to said other milled lamina.

22. A method according to claim 21 wherein the first chemical milling step removes metal between both the regions of relative flexibility and the terminals and the subsequent chemical milling step removes material between both said the regions of relative flexibility and the terminals and to reduce the thickness of the sheet in the regions of relative flexibility.

23. A method according to claim 21 comprising extending at least one said insulating sheet over transitions from relatively flexible regions to the relatively thicker cross-section of the relatively rigid terminals thereby to reinforce the cable at these transitions.

24. A method according to claim 23 comprising extending both said insulating sheets over transitions from relatively flexible regions to the relatively thicker cross-section of the relatively rigid terminals thereby to reinforce the cable at these transitions.

25. A cable when made by a method of forming a cable having a relatively flexible electrical conductor integral with a relatively rigid electrically conductive terminal wherein said terminal (1) is generally flat, (2) is thicker in cross-section than at least one of said conductor, and (3) derives its relative rigidity by virtue of the relative thicker cross-section, said method comprising the steps of:

(A) providing a relatively rigid laminate of cross-sectional thickness substantially equal to that required for said terminal; said laminate comprising two electrical conductive structural layers separated by an electrically conductive barrier layer;

(B) selectively reducing portions of said laminate in cross-section to the barrier layer, by a process which is constrained by the barrier layer, so as to (i) increase the relative flexibility of said cable in said at least one region, and (ii) define, in situ, said conductor and said terminal; and (C) covering said conductor at least in part with a flexible insulating material.

26. A cable when made by a method of forming a cable having a plurality of spaced relatively flexible electrical conductors each integral with a relatively rigid electrically conductive terminal wherein said terminals (1) are generally flat, (2) are thicker in cross-section that relatively flexible electrical conductors, and (3) derive their relative rigidity by virtue of their relative thicker cross-section, said method comprising the steps of:

(A) providing a relatively rigid laminate of a cross-sectional thickness substantially equal to that required for said terminals; said laminate having two structural electrically conductive laminae spaced apart by an electrically conductive barrier layer;

(B) selectively reducing portions of said laminate in cross-section to the barrier layer so as to define, in situ, said terminals, and said conductors, said terminals being approximately of said thickness; and (C) laminating said conductors between a pair of flexible insulating films so as to support and maintain said conductors together with their terminals in spaced relation to one another.

27. A cable when made by a method of forming a cable having a plurality of spaced metallic electrically conductive elements, each of said elements including at least one relatively rigid terminal and at least one region of relative flexibility wherein said terminals (1) are thicker in cross-section than the regions of relative flexibility, and (2) derive their relative rigidity by virtue of their relative thicker cross-section, said method comprising the steps of:

(A) providing a composite metallic sheet of a cross-sectional thickness substantially equal to that required for said relatively rigid terminals; said sheet comprising two laminae, each comprising one of copper and an alloy in which copper is a major constituent, spaced by and in intimate electrically conductive contact throughout with an electrically conductive barrier layer, said laminae and said barrier layer being etchable by at least one selection of mutually exclusive etchants;

(B) chemically milling said composite metallic sheet to (i) increase the relative flexibility of said sheet in the regions and (ii) define in situ a plurality of spaced elements including said terminals, said chemical milling involving:

first chemically milling one of said laminae, using an etchant which is not an etchant for the barrier layer, so as to improve metal from selected portions thereof to a depth constrained by said barrier layer so as partially to define, in situ, a pattern of said elements including said terminals; bonding a first insulating sheet to said milled lamina; then chemically milling the other of said laminae, using an etchant which is not an etchant for the barrier layer, so as to remove metal from selected portions thereof to a depth constrained by said barrier layer so as to further define, in situ, the pattern;

subsequently stripping the barrier layer using an etchant, which is not an etchant for the laminae, to define, in situ, said pattern; and bonding a second insulating sheet to said other milled lamina.

* * * * *